United States Patent [19]

Wohlmut et al.

[11] 4,155,371

[45] May 22, 1979

[54] LUMINESCENT SOLAR COLLECTOR

[75] Inventors: Peter G. Wohlmut, Palo Alto; John W. Yerkes, Granada Hills, both of Calif.

[73] Assignee: Atlantic Richfield Company, Los Angeles, Calif.

[21] Appl. No.: 945,744

[22] Filed: Sep. 25, 1978

[51] Int. Cl.² ............................................. H01L 31/04
[52] U.S. Cl. ............................ 136/89 FC; 136/89 CL
[58] Field of Search .......... 136/89 FC, 89 CL, 89 CA

[56] References Cited
U.S. PATENT DOCUMENTS

| | | | |
|---|---|---|---|
| 3,591,420 | 7/1971 | Streed | 136/89 |
| 4,110,123 | 8/1978 | Goetzberger et al. | 136/89 H X |

Primary Examiner—Aaron Weisstuch
Attorney, Agent, or Firm—Roderick W. MacDonald

[57] ABSTRACT

A luminescent solar collector having a luminescent member with at least two types of photovoltaic cells, each type of cell operating efficiently for the generation of electricity over a wavelength range which is different from the efficient wavelength range of the other types of photovoltaic cells present on the luminescent member, each type of photovoltaic cell carrying intermediate to it and the luminescent member a filter means which allows only light within the efficient wavelength range for that type of photovoltaic cell to pass from the luminescent member into the photovoltaic cell.

2 Claims, 4 Drawing Figures

LUMINESCENT SOLAR COLLECTOR

BACKGROUND OF THE INVENTION

It is known that a photovoltaic semiconductor p-n junction can convert to electricity only that portion of the incident photon energy spectrum, typically solar radiation, which creates hole-electron pairs within a given semiconductor material. For example, in a silicon photovoltaic cell only that portion of the solar spectrum with energy slightly greater than or equal to the 1.1 electron volt band gap is converted into electricity. Photons of lesser energy do not generate electricity. More energetic photons are absorbed but much of the energy is lost in heating the cell. It is this heating and absorption process that can degrade the cell's energy conversion efficiency. To maximize the efficiency of a given photovoltaic cell, it is advantageous to convert as much of the available light as possible into an energy range to which such cell can optimally respond in the generation of electricity before the light strikes the cell's surface.

One technique for achieving such conversion takes advantage of the fact that light falling upon a luminescent agent is characteristically reradiated or emitted in a band of wavelengths of known energy content. Also, light absorbed by such an agent in one direction is reradiated isotropically. Such agents include, for example, pigments, metal oxides and organic dyes which are used in scintillation counters, lasers, and the like. For the purpose of this invention the term "luminescent agent" includes all types of luminescent agents exhibiting all species of luminescence, including, but not limited to, fluorescence and phosphorescence.

It has been shown that the dispersal of a luminescent agent within a sheet of glass or plastic, one of whose major surfaces is exposed to light, concentrates and focuses a flux of light of known energy toward one or more of the thin edge faces of the sheet. If a photovoltaic cell responsive to light at that energy level is optically coupled to such edge face, the energy conversion efficiency of the cell increases. In this invention a light transmissive member of such construction and properties is termed a "luminescent member" and a photovoltaic solar collector employing such a member is termed a "luminescent solar collector". A luminescent solar collector of this type is fully and completely disclosed in *Optics*, Vol. 15, No. 10, pages 2299–2300, dated October, 1976, the disclosure of which is incorporated herein by reference.

SUMMARY OF THE INVENTION

According to this invention there is provided a luminescent solar collector which has a luminescent member with at least two types of photovoltaic cells operably associated therewith, i.e., optically coupled therewith, each type of photovoltaic cell operating efficiently for the generation of electricity over a wavelength range which is different from the efficient wavelength range of the other types of photovoltaic cells present on the luminescent member. Each type of photovoltaic cell carries intermediate to it and the luminescent member a filter means which allows only light which is within the efficient wavelength range for that type of photovoltaic cell to pass from the luminescent member into the photovoltaic cell.

By this invention, light which is not within the efficient wavelength range of a particular photovoltaic cell is not allowed to enter that cell and thereby become lost for the generation of electricity. This invention maximizes the retention of usable light within the luminescent member unless and until it finds a photovoltaic cell whose efficient wavelength range for the generation of electricity covers the wavelength range of that light.

Accordingly, it is an object of this invention to provide a new and improved luminescent solar collector. It is another object to provide a new and improved luminescent solar collector which employs a plurality of different types of photovoltaic cells.

Other aspects, objects and advantages of this invention will be apparent to those skilled in the art from this disclosure and the appended claims.

DETAILED DESCRIPTION OF THE INVENTION

Figure 1:
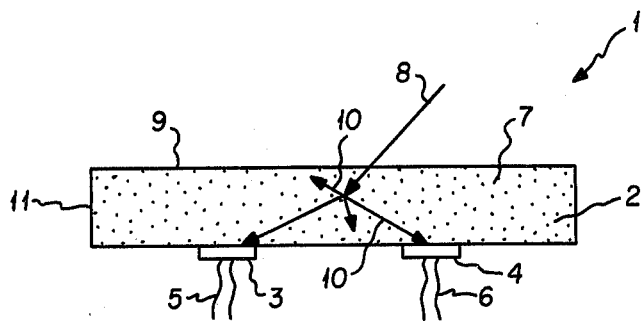
FIG. 1 shows an elevation of one embodiment of a collector within this invention.

More specifically, FIG. 1 shows a luminescent solar collector 1 composed of a luminescent member 2 which has attached on one side thereto, two photovoltaic cells 3 and 4, which are different types of cells, such as a silicon cell 3 and a gallium arsenide cell 4. Photovoltaic cells can be mounted on edge faces 11, as is known in the art, in addition to or in lieu of cells 3 and 4. Also, reflective means (not shown) can be employed in known manner on edge faces 11. Pairs of electric wires 5 and 6 are electrically attached to cells 3 and 4, respectively, for the removal of electricity therefrom in a conventional manner. Luminescent member 2 comprises a plurality of luminescent agents 7 dispersed and/or dissolved in a light transmitting matrix material.

Accordingly, as is known in the art, a ray of light 8 enters luminescent member 2 through upper side 9, strikes, and is absorbed by luminescent agent 7. Agent 7 then reradiates light of an average longer wavelength than the original wavelength range of light ray 8 in isotropic directions as indicated by arrows 10, two of which are directed toward different types of cells 3 and 4.

Figure 2:
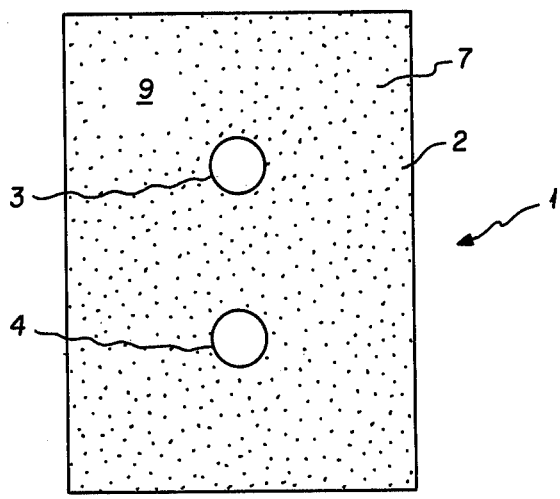
FIG. 2 shows a top view of the collector of FIG. 1.

FIG. 2 shows a view looking towards upper surface 9 of collector 1.

Figure 3:
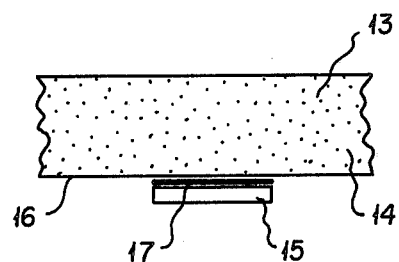
FIG. 3 shows an enlarged view of the luminescent member, filter, and one photovoltaic cell of the collector of FIG. 1.

FIG. 3 shows a cross section of a luminescent member 13 having luminescent agent 14 disposed throughout and carrying a photovoltaic cell 15 which has intermediate to it and lower surface 16 of luminescent member 13, a filter means 17. Filter means 17 allows light to pass from inside luminescent member 13 into photovoltaic cell 15 only when that light is of a wavelength which is within the efficient wavelength range for the generation of electricity of cell 15. If the light inside luminescent member 13 which is trying to reach cell 15 does not meet the wavelength criteria just set forth, it cannot efficiently pass through filter 17. Such light will instead be internally reflected back into luminescent member 13 and thus conserved for the time when it does reach a photovoltaic cell on luminescent member 13 of a different type from cell 15 and whose filter means will allow the light to pass into that different type of cell for the generation of electricity.

Figure 4:
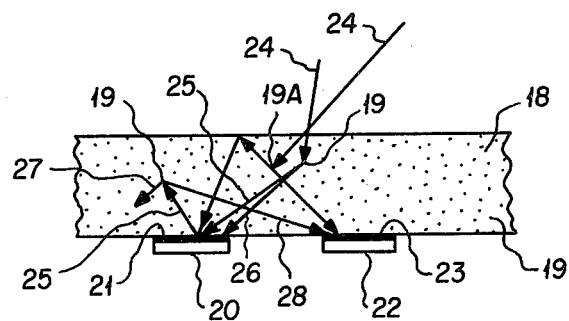
FIG. 4 shows yet another enlarged view wherein two photovoltaic cells are present, and demonstrates the retention of light in the luminescent member until it finds the right photovoltaic cell.

FIG. 4 shows a luminescent member 18 with luminescent agents 19 dispersed uniformly throughout and carrying a photovoltaic cell 20 with an intermediate filter 21, cell 20 being of one type such as boron and phosphorous doped silicon. Member 18 carries another cell 22 with intermediate filter 23, cell 22 being of a different type such as aluminum doped gallium arsenide.

Thus, light rays 24 enter luminescent member 18 and strike luminescent agents 19 and 19A and, for sake of simplicity, reradiates two subrays of light 25 and 26 from agent 19. Subrays 25 and 26 are of a different and longer wavelength range than the average wavelength of original light ray 24. Both subrays 25 and 26 are directed towards cell 20. Silicon cell 20 has an intermediate filter 21 which allows light in the wavelength range from 800 nanometer (nm) to 1100 nm to pass into silicon cell 20 because silicon cell 20 can convert light in this wavelength range quite efficiently to electricity. Filter 21 reflects light outside this range. Suppose subray 26 is of a wavelength within the efficient wavelength range for silicon 20 while subray 25 is not within this wavelength range. Accordingly, filter means 21 will allow ray 26 to leave luminescent member 18 and pass into cell 20 for the generation of electricity whereas it will reflect subray 25 back into luminescent member, thereby conserving that light energy rather than letting it be lost in silicon cell 20. Suppose further that subray 25 is reflected back into luminescent member 18 and strikes another luminescent agent 19 whereby two additional subrays 27 and 28 are reradiated by the luminescent agent, subray 28 being directed towards gallium arsenide cell 22. If subray 28 is of a wavelength which is within the efficient wavelength range for gallium arsenide cell 22, then that cell's filter means 23 will allow subray 28 to leave luminescent member 18 and pass into gallium arsenide cell 22 for the generation of electricity.

It can be seen that that portion of the energy of subray 25 which is represented by subray 28 was, by this invention, conserved by reflection back into the luminescent member from filter means 21 and ultimately converted into usable electricity when the light energy represented by subray 28 finally did reach a cell 22 which could utilize the wavelength energy of subray 28 for the generation of electricity. It is also possible for subray 28 to be internally reflected such as by reflective means and transferred to cells 20 or 22.

This invention provides a more efficient luminescent solar collector by employing a plurality of different types of photovoltaic cells, each having its own special efficient wavelength range for the generation of electricity and by employing a filter means tailored for each type of photovoltaic cell which allows only light within the efficient wavelength range of that cell to leave the luminescent member and enter the cell.

There are a number of ways in which a filter means can be matched to a particular photovoltaic cell to accomplish the desired results as set forth hereinabove for this invention. One such way is to employ a quarter wave technique wherein a material selected from the group consisting of $Ta_2O_5$, $Nb_2O_5$ and $TiO_x$, e.g., TiO and $TiO_2$, is employed as the filter means and the thickness of the filter means is varied depending upon the maximum band gap wavelength of the particular cell. This technique employs the formula $\lambda n/4$, where $\lambda$ is the maximum band gap wavelength in the efficient wavelength range of each type of photovoltaic cell employed on the luminescent member and n is the material's index of refraction. By varying the thickness of the filter means in accordance with the above formula, the desired segregation of light outside the efficient wavelength range of the particular cell with which the filter is employed can be achieved.

The luminescent member matrix material can be a polymeric or glass material which is transparent at least to the visible light spectrum. Such matrix material can therefore be of conventional plastic polymeric material such as polymethylmethacrylate, other known acrylic polymers, styrene polymers, and the like. The material can be glass or other similar transparent material into which luminescent agents can be incorporated and which, like the polymeric material, are nondeleterious to the luminescent agents, the photovoltaic cells, and the like. The matrix material can be any light transmitting material heretofore used in the manufacture of conventional nonluminescent photovoltaic devices. The matrix materials preferably do not contain impurities such as iron and the like which would absorb light rather than allow it to pass on to a photovoltaic cell.

The luminescent agents can include metals or oxides or other compounds of metals such as neodymium oxide employed in a glass matrix or one or more laser dyes such as the coumarin family of dyes and the rhodamine family of dyes. These dyes are quite complex chemically. All of these materials and the characteristics thereof are well known in the art and are commerically available so that further detailed description is unnecessary to inform one skilled in the art.

The luminescent agent or agents are simply dispersed in the matrix material by mixing or other dispersion while the matrix material is in a fluid state due to heating and the like.

Photovoltaic cells are well known in the art and vary widely as to their characteristics and can include, without limitation, silicon, cadmium sulfide, germanium, gallium arsenide, and many other known semiconductor materials.

EXAMPLE

A luminescent solar collector constructed as shown in FIGS. 1 and 4 is employed using the silicon and the gallium arsenide cells and filter means such as described hereinabove in reference to FIG. 4, wherein an antireflection coating peaked at the optimum response wavelength for the silicon and gallium arsenide cells are utilized. The light transmitting matrix material of luminescent member is polymethylmethacrylate and the luminescent agent is coumarin and rhodamine dyes.

By this combination of materials, the desired filtering of light best suited for the generation of electricity for the two different types of cells present is achieved.

Reasonable variations and modifications are possible within the scope of this disclosure without departing from the spirit and scope of this invention.

The embodiments of the invention in which an exclusive property or privilege is claimed are defined as follows:

1. A luminescent solar collector comprising a luminescent member having at least two types of photovoltaic cells operably associated therewith, each type of photovoltaic cell operating efficiently for the generation of electricity over a wavelength range which is different from the efficient wavelength range of the other types of photovoltaic cells present, each type of photovoltaic cell carrying intermediate it and said luminescent member a filter means which allows only light within the efficient wavelength range for that type of photovoltaic cell to pass from said luminescent member into said photovoltaic cell.

2. A luminescent solar collector according to claim 1 wherein said filter means is composed of at least one material selected from the group consisting of $Ta_2O_5$, $Nb_2O_5$ and $TiO$, and the thickness of said filter means is based on the formula $\lambda n/4$, where $\lambda$ is the maximum band gap wavelength in the efficient wavelength range of the particular type of photovoltaic cell in question and n is the index of refraction of the material.

* * * * *